United States Patent [19]

Logan et al.

[11] 4,190,813
[45] Feb. 26, 1980

[54] STRIP BURIED HETEROSTRUCTURE LASER

[75] Inventors: Ralph A. Logan, Morristown; Won-Tien Tsang, New Providence, both of N.J.

[73] Assignee: Bell Telephone Laboratories, Incorporated, Murray Hill, N.J.

[21] Appl. No.: 865,237

[22] Filed: Dec. 28, 1977

[51] Int. Cl.$^2$ .............................................. H01S 3/19
[52] U.S. Cl. ................................ 331/94.5 H; 357/18
[58] Field of Search ................ 331/94.5 H; 357/16–18

[56] References Cited

U.S. PATENT DOCUMENTS

| | | | |
|---|---|---|---|
| 3,883,821 | 5/1975 | Miller | 331/94.5 H |
| 3,978,426 | 8/1976 | Logan et al. | 331/94.5 H |
| 3,978,428 | 8/1976 | Burnham et al. | 331/94.5 H |
| 3,984,262 | 10/1976 | Burnham et al. | 331/94.5 H X |
| 4,045,749 | 8/1977 | Burnham et al. | 331/94.5 H |

OTHER PUBLICATIONS

Tsukada, "GaAs–Ga$_{1-x}$Al$_x$As Buried-Heterostructure Injection Laser," *J. Appl. Phys.*, vol. 45, No. 11, Nov. 1974, pp. 4899–4906.

*Primary Examiner*—James W. Davie
*Attorney, Agent, or Firm*—Michael J. Urbano

[57] ABSTRACT

A double heterostructure laser having a pair of opposite-conductivity-type, wide bandgap cladding layers separated by a narrower bandgap active region is characterized in that the active region includes a low-loss waveguide layer and contiguous therewith a narrower bandgap active layer in the form of a narrow strip which extends along the longitudinal (resonator) axis of the laser. Suitable lateral current confinement means, such as reversed biased p-n junctions, are provided to constrain pumping current to flow in a narrow channel through the active layer. Lasers of this type exhibit relatively high pulsed power outputs (e.g., 400 mW), linear L-I characteristics, stable fundamental transverse mode and single longitudinal mode oscillation. In another embodiment the surfaces of the waveguide layer adjacent the active layer are provided with distributed feedback gratings. Also described are techniques for shaping the active layer without the introduction of debilitating defects therein, as well as procedures for LPE growth on Al-containing Group III-V compound layers which are exposed to processing in the ambient.

21 Claims, 3 Drawing Figures

STRIP BURIED HETEROSTRUCTURE LASER

BACKGROUND OF THE INVENTION

This invention relates to semiconductor junction lasers.

The stripe-geometry contact for junction lasers was proposed by R. A. Furnanage et al. (U.S. Pat. No. 3,363,195, granted Jan. 9, 1968) more than a decade ago and has been incorporated, in one form or another, in various heterostructure laser configurations in use and under study today. These lasers, which range from the simple double heterostructure (DH) (I. Hayashi, U.S. Pat. No. 3,758,875, granted Sept. 11, 1973) to more complicated buried heterostructures (BH) [T. Tsukada, *Journal of Applied Physics*, Vol. 45, p. 4899 (1974)], each have one or more advantageous operating characteristics.

The DH laser has the longest lifetime of all semiconductor lasers, exceeding $10^5$ hours to date, and is characterized by low thresholds and fundamental transverse mode operation. On the other hand, it has a wide beam divergence, a nonlinearity (known as a "kink") in its light-current (L-I) characteristic, and incomplete lateral current confinement.

The Tsukada BH laser, which includes a GaAs active region completely surrounded by $Al_{0.3}Ga_{0.7}As$, has effective transverse mode stabilization, but the refractive index change along the junction plane is so large that stable fundamental mode lasing is possible only for active layer widths of $\leq 1$ $\mu$m, resulting in low output power (e.g., 1 mW) and large beam divergence in both transverse directions. In BH lasers with wider active layers, higher order modes are easily excited near threshold.

SUMMARY OF THE INVENTION

In accordance with one embodiment of our invention a strip buried heterostructure (SBH) laser comprises a pair of opposite-conductivity-type, wide bandgap, semiconductor cladding layers separated by a narrower bandgap, semiconductor active region characterized in that the active region includes a low-loss waveguide layer and contiguous therewith a narrower bandgap active layer in the form of a narrow strip which extends along the longitudinal (resonator) axis of the laser. Preferably, the bandgap difference between the waveguide and active layers is sufficiently large to confine to the active layer minority carriers injected therein when the cladding layers are forward biased, yet small enough to allow a significant portion of the stimulated radiation generated in the active layer to be coupled into the waveguide layer, thereby reducing the optical power density at the mirror facets. In addition, it is also preferable that the bandgap difference between the waveguide layer and the contiguous opposite-conductivity-type cladding layer be large enough to prevent significant leakage current between the two layers under normal operating conditions of the laser.

Means are also preferably provided for constraining pumping current to flow in a narrow channel through the strip-shaped active layer. In one embodiment, the constraining means includes a pair of laterally spaced reverse-biased p-n junctions near the top surface of the laser. However, other constraining means, such as proton bombardment, are also suitable.

An illustrative embodiment of our SBH laser was fabricated from the GaAs-AlGaAs materials system and exhibited, over a wide operating range, high power output, a linear L-I characteristic for all currents up to catastrophic failure, stable fundamental transverse and single longitudinal mode oscillation and reduced beam divergence, along with adequate lasing thresholds and external quantum efficiencies.

In other embodiments of our invention, the strip active layer is partially embedded in the low-loss waveguide layer instead of being formed on top of a major surface of the waveguide layer. In either case, however, the portions of the major surface of the waveguide layer adjacent the active layer can be provided with distributed feedback gratings.

Another aspect of our invention is a method for defining the geometry of the strip active layer, or other device active region, without the introduction of debilitating defects therein during shaping operations. A thin epitaxial protective is grown on the active layer before it is masked and shaped (e.g., by etching and/or anodization), the protective layer is selectively etched away in mask openings to expose the active layer, and thin portions of the active layer are removed (e.g., by anodization) to define the desired geometry. In the fabrication of our SBH laser, these procedures are followed by growing over the shaped structure a cladding layer having a composition essentially identical to that of the protective layer so that the latter is incorporated into the former.

One additional aspect of our invention entails a procedure for epitaxially growing a Group III-V compound second layer (e.g., the AlGaAs cladding layer) from the liquid phase on an Al-containing Group III-V compound first layer (e.g., the AlGaAs waveguide layer). After growth of the first layer, a non-Al-containing Group III-V compound epitaxial protective layer (e.g., GaAs) about several hundred angstroms thick is formed on a major surface of the first layer before exposing the first layer to an ambient which would otherwise oxidize it. Processing, such as etching and/or anodization, can be used to form the protective layer from a much thicker layer (e.g., that from which the active strip of an SBH laser is formed), or in some applications the thin layer may be grown directly (e.g., by deposition of the first layer and the protective layer by molecular beam epitaxy). In either event, state of the art technology has demonstrated that LPE yields better quality layers for optical devices than MBE, but LPE growth on ambient-exposed Al-containing layers is difficult because Al tends to oxidize so readily. The protective layer enables the use of LPE because the molten solution used to grow the second layer dissolves the protective layer so that the second layer grows directly on the first layer.

BRIEF DESCRIPTION OF THE DRAWING

Our invention, together with its various features and advantages, can be readily understood from the following more detailed description taken in conjunction with the accompanying drawing, in which the figures are not drawn to scale for clarity of illustration.

DETAILED DESCRIPTION

SBH Laser Structure

Figure 1:
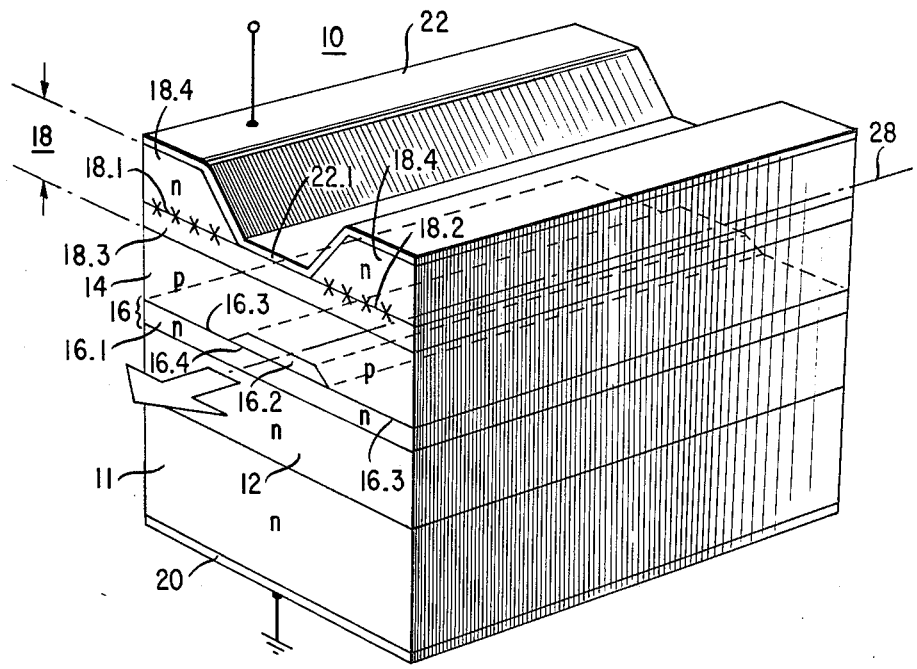
FIG. 1 is a schematic isometric view of an SBH laser in accordance with one embodiment of our invention in which the strip active layer is formed on top of a major surface of the waveguide layer.
Figure 2:
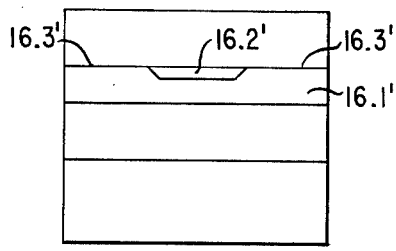
FIG. 2 is an end view of an SBH laser in accordance with another embodiment of our invention in which the strip active layer is partially embedded in the waveguide layer.

With reference now to FIG. 1, there is shown an SBH laser 10 formed on a substrate 11 and comprising first and second opposite-conductivity-type, wide bandgap, semiconductor cladding layers 12 and 14 separated by a narrower bandgap, semiconductor active region 16 characterized in that active region 16 includes a low-loss waveguide layer 16.1 and contiguous therewith a narrower bandgap active layer 16.2 in the form of a narrow strip which extends along the longitudinal (resonator) axis 28 of the laser. The narrow strip may be formed on top of a major surface of waveguide layer 16.1 as in FIG. 1 or, as shown by layer 16.2' of FIG. 2, may be partially embedded in waveguide layer 16.1'. In the latter case, the major surface of the waveguide layer is essentially coplanar with a major surface of the active layer.

Means 18 is provided for constraining pumping current to flow in a narrow channel through the active layer 16.2 (or 16.2') when cladding layers 12 and 14 are forward biased above the lasing threshold. Forward bias voltage is applied by means of suitable ohmic contacts 20 and 22 formed on substrate 11 and means 18, respectively.

In the embodiment shown, constraining means 18 comprises a pair of laterally spaced p-n junctions 18.1 and 18.2 which are reverse biased when cladding layers 12 and 14 are forward biased. The junctions are formed by depositing on cladding layer 14 a layer 18.3 of the same conductivity type and then forming a bifurcated, wider bandgap, opposite-conductivity-type layer 18.4 on layer 18.3. This fabrication technique is described more fully in our copending application Ser. No. 794,466, filed on May 6, 1977. The junctions 18.1 and 18.2 are thus separated by a window which exposes a strip of layer 18.3. That strip is contacted by the central portion 22.1 of ohmic contact 22 so that pumping current flows transversely through the layers in a narrow channel from contact portion 22.1 in the window to active layer 16.2. Current spreading can be further reduced by incorporating an additional pair of spaced, reverse biased p-n junctions at the substrate interface by the techniques described in our aforementioned copending application or by using other prior art schemes referenced in that application.

In addition, making the bandgap of cladding layer 14 sufficiently greater than that of active layer 16.2 prevents any substantial amount of pumping current from bypassing the active layer 16.2 by flowing directly between the cladding and waveguide layers; i.e., the turn-on voltage of p-n heterojunctions 16.3 between the waveguide and cladding layers is larger (e.g., 1.6 V) than the turn-on voltage of p-n heterojunction 16.4 between the waveguide and active layer (e.g., 1.4 V).

The pumping current causes the injection of minority carriers into active layer 16.2 where they undergo radiative recombination to generate stimulated radiation. A significant portion of the optical field of this radiation preferably penetrates into the waveguide layer 16.1 so as to reduce the optical power density at the mirror facets and thereby increase the threshold for catastrophic damage. To this end the bandgap (or refractive index) difference between active layer 16.2 and waveguide layer 16.1 should be small enough to permit such penetration, yet large enough to confine injected minority carriers to the active region and thereby maintain relatively high electronic gain. This laser configuration, we have found, exhibits relatively high pulsed power outputs (in the hundreds of milliwatts range) and, surprisingly, a linear L-I characteristic-free of kinks—at all power levels up to the catastrophic damage threshold. In addition, this SBH laser exhibited stable fundamental transverse and single longitudinal mode operation.

In order to reduce the number of nonradiative recombination defect centers at the heterojunction interfaces between the various layers of our SBH laser, it is preferred that essentially lattice matched materials be utilized. Fewer defect centers in general means lower lasing thresholds and longer lifetimes. In the Group III-V compound system these materials include, for example, GaAs-AlGaAs, GaAs-AlGaAsP, GaAsSb-AlGaAsSb and InP-InGaAsP. Of these, GaAs-AlGaAs has the advantage that it is substantially lattice matched over all solid solutions of GaAs and AlAs. Using the latter system, the SBH laser of FIG. 1 would typically comprise an n-GaAs substrate on which the following layers would be epitaxially grown: an n-$Al_xGa_{1-x}As$ cladding layer 12 ($0<x<1$); an n-$Al_yGa_{1-y}As$ waveguide layer 16.1 ($0<y<1$; $y<x$); an n-, p- or compensated active layer 16.2 of $Al_zGa_{1-z}As$ [$0 \leq z < 0.4$; $z < y$; and ($y-z$) adapted to confine injected carriers to the active layer while at the same time permitting the optical field to penetrate from the active layer into the waveguide layer]; a p-$Al_qGa_{1-q}As$ cladding layer 14 [$0<q<1$; $q>z$ and $y$; and $(q-y)>(y-z)$ to prevent significant pumping current from flowing across heterojunctions 16.3]; a p-GaAs stop-etch and contacting layer 18.3, and an n-$Al_rGa_{1-r}As$ bifurcated layer 18.4 ($0<r<1$). Of course, it is obvious that the conductivity types of the various layers can be reversed.

For efficient operation at room temperature the SBH laser is mounted on a heat sink (not shown) by means well known in the art, and for continuous wave operation at room temperature, the thickness of the active layer 16.2 should be less than 1.0 μm and preferably about 0.15–0.20 μm.

Figure 3:
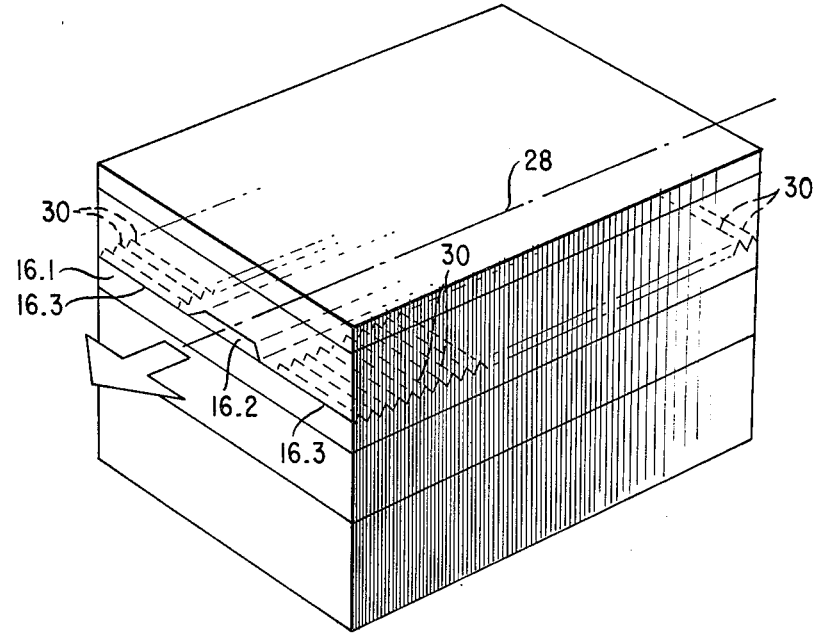
FIG. 3 is a schematic isometric view of an SBH laser in accordance with yet another embodiment of our invention in which distributed feedback gratings flank the strip active layer.

An alternative embodiment of our SBH laser incorporates a distributed feedback (DFB) grating which provides frequency selectivity and in integrated optics applications obviates the need for a discrete resonator formed by cleaved mirror facets. As shown in FIG. 3, the DFB grating comprises a plurality of parallel grooves 30 which are formed on the same major surface of waveguide layer 16.1 as active layer 16.2, i.e., on heterojunctions 16.3. But, the grooves are formed on opposite sides of the active layer 16.2 and extend perpendicular to the resonator axis 28 (i.e., perpendicular to the elongated dimension of strip active layer 16.2). As is well known in the art, to provide feedback the periodicity of the grating should preferably be equal to an odd integral number of half wavelengths of the laser radiation as measured in the semiconductor. This grating would typically be formed, for example, by ion milling or chemically etching waveguide layer 16.1 after depositing and suitably masking active layer 16.2. Note that the interior ends of the grating grooves should preferably be as close to the sides of the active layer as possible to allow the optical field in the active layer 16.2 to penetrate into the grating. Illustratively, the grating ends should be within 1-2 μm of the active region. Although not depicted, the DFB configuration of FIG. 3 could also be incorporated into the embodiment of FIG. 2 by forming the grating, as before, on the heterojunctions 16.3' on opposite sides of active layer 16.2'. In this case, the interior ends of the grating grooves can be made right next to the sides of the embedded active strip 16.2' by fabricating the grating first, uniformly everywhere, then etching the channel for the embedded strip 16.2'.

In prior art buried heterostructure (BH) lasers, effective transverse mode stabilization has been achieved by introducing a built-in refractive index change along the junction plane; for example, by embedding an active GaAs core completely in $Al_{0.3}Ga_{0.7}As$ cladding. However, the index change along the junction plane is so large that stable fundamental mode lasing is possible only for active layer widths of $\leq 1$ μm, resulting in low output power and large beam divergence in the two transverse directions. Yet, in lasers with wider active layers, higher order modes are easily excited near threshold.

In our SBH laser, the introduction of the waveguide layer converts the core in a BH laser to a strip-loaded waveguide having the thin active layer as the strip and the thicker low-loss waveguide as the supporting layer. This structure significantly reduces the effective refractive index change along the junction plane. Hence, operation in the fundamental transverse mode along the junction plane can be easily obtained with much wider strip widths. As a result, the output power is increased and the beam divergence is reduced, while mode stabilization is maintained. Furthermore, better device fabrication and performance control can be achieved.

In the direction perpendicular to the junction plane, the introduction of the waveguide layer greatly increases the cavity thickness (e.g., from about 0.2 μm to about 1.6 μm) while still providing enough potential barrier to confine the injected carriers in the active strip. This thickening of the optical cavity does not affect the threshold current but increases the output power before catastrophic mirror failure and reduces the beam divergence. Since the active strip is much thinner than the waveguide layer, the fundamental transverse mode (perpendicular to the junction plane) acquires more gain than higher order modes. This provides mode discrimination against higher order modes even though they have slightly higher mirror reflectivity. Finally, the waveguide layer is not expected to decrease the quantum efficiency of the laser because it is essentially lossless at the lasing wavelength. Therefore, low current threshold, stable fundamental transverse mode operation with linear light-current characteristic and narrow beam divergence in both transverse directions up to substantially high injection current levels, and high output power should be obtainable with our SBH lasers. Indeed these properties have been observed as discussed in the example which follows.

Example

The following describes the fabrication of an SBH laser from the GaAs-AlGaAs materials system. Dimensions, materials, conductivity types and carrier concentrations are intended to be illustrative only and should not be construed as limitations on the scope of the invention.

Using a two-cycle liquid phase epitaxy (LPE) technique, with suitable masking, etching and anodization steps between the two cycles, we fabricated SBH lasers of the type depicted in FIG. 1 comprising: a (001) oriented n-GaAs substrate 11 doped with Si to about $10^{18}$ cm$^{-3}$ and about 100 μm thick; an n-$Al_{0.3}Ga_{0.7}As$ cladding layer 12 doped with Sn to about $2\times 10^{17}$ cm$^{-3}$ and about 1.4 μm thick; an n-$Al_{0.1}Ga_{0.9}As$ waveguide layer 16.1 doped with Sn to about $2\times 10^{17}$ cm$^{-3}$; a p-GaAs active layer 16.2 doped with Ge to about $3\times 10^{17}$ cm$^{-3}$ and about 0.2 μm thick and of various widths—2.5, 3.5, 5. 7.5 or 10 μm; a p-$Al_{0.3}Ga_{0.7}As$ cladding layer 14 doped with Ge to about $3\times 10^{17}$ cm$^{-3}$ and about 2.5 μm thick; a p-GaAs contacting and stop-etch layer 18.3 doped with Ge to about $5\times 10^{17}$ cm$^{-3}$ and about 0.5 μm thick; and an n-$Al_{0.45}Ga_{0.55}As$ layer 18.4 doped with Sn to about $10^{17}$ cm$^{-3}$ and about 1 μm thick. The layer 18.4 had various window openings of comparable size to the underlying active strips 16.2 and in substantial registration therewith. The substrate contact 20 comprised a Au-Sn alloy whereas the top contact 22 comprised a Au-Zn alloy.

The fabrication of these SBH lasers proceeded as follows. During the first LPE growth cycle, layers 12 and 16.1 as described above were deposited on an n-GaAs wafer (i.e., on the substrate 11) and then a p-GaAs layer was deposited having a thickness equal to that desired for the active layer 16.2. A thin (about 0.2 μm) p-$Al_{0.3}Ga_{0.7}As$ layer was then grown on the p-GaAs layer. Note, the last layer was deposited to protect the top interface of the active layer during subsequent processing steps and does not yet correspond to the much thicker cladding layer 14. This intermediate structure was removed from the LPE chamber and the top surface of the thin $Al_{0.3}Ga_{0.7}As$ layer was anodized to form a native oxide masking layer thereon. Standard photolithographic techniques were then used to form mask strips along the (110) direction in the oxide layer and to expose the thin $Al_{0.3}Ga_{0.7}As$ layer between the strips. The exposed $Al_{0.3}Ga_{0.07}As$ was selectively etched in an iodine etchant (113 g KI, 65 g $I_2$, 100 cc $H_2O$) to expose the p-GaAs layer between the strips. Standard anodization (which forms a native oxide and consumes a portion of the semiconductor) and stripping were then used to remove nearly all of the p-GaAs layer between the strips. It was important, however, to leave a thin (about 200 Angstrom thick) layer of p-GaAs between the strips so as not to expose the underlying n-$Al_{0.1}Ga_{0.9}As$ to the atmosphere. Such exposure makes subsequent LPE growth on Al-containing Group III-V compounds very difficult.

After removing the oxide strip masks and subsequent chemical cleaning, the structure on the wafer comprised layers 12 and 16.1 with strip mesas of p-GaAs (i.e., active layer 16.2) protected by the thin $Al_{0.3}Ga_{0.7}As$ layer. The spaces between mesas were protected with the thin (about 200 Angstrom thick) p-GaAs layer.

Next, the wafer was returned to the LPE chamber and p-$Al_{0.3}Ga_{0.7}As$ layer 14 was grown thereon. During this growth step the thin p-$Al_{0.3}Ga_{0.7}As$ layers protecting the tops of the active layers were incorporated into layer 14, and the thin p-GaAs layer between the strips were dissolved into the melt used to grow layer 14. Therefore, layer 14, for all practical purposes, grew directly on the portions of waveguide layer 16.1 between the strips as well as on the strips themselves.

The contacting and stop-etch p-GaAs layer 18.3 was then grown followed by an n-$Al_{0.45}Ga_{0.55}As$ layer. The latter was masked, using the same photolithographic mask used to define the strips, and then selectively etched, using the iodine etchant previously described, down to the p-GaAs layer 18.3, thereby bifurcating the n-Al$_{0.45}$Ga$_{0.55}$As layer as depicted by layer 18.4 of FIG. 1. Individual SBH laser diodes were then formed by conventional metallization, cleaving and heat-sinking procedures.

Light-current (L-I) characteristics of our SBH lasers without anti-reflection mirror coatings were made using standard measurement procedures. The measurements with pulsed injection (150 ns pulse width, 1000 pulses/sec) were made for active layer widths of about 5 μm and 10 μm and lengths of 380 μm. The top channel (window in layer 18.4) widths of the lasers with 10 μm and 5 μm wide active strips were typically about 15 μm and 10 μm, respectively. All lasers tested displayed excellent linearity in L-I characteristics. For lasers with 10 μm strips, this linearity continued, without catastrophic failure, to about 10 times threshold current where a peak power output of 400 mW per face was measured. One laser with a 5 μm strip was tested to the catastrophic failure limit. For that laser linearity continued up to about 15 times threshold at which a peak power output of 230 mW per face was measured. At this power catastrophic failure occurred. Similarly, we measured the light-current characteristics of other SBH lasers with 5 μm wide active layers pumped only to an output power of 100 mW per face to avoid burnout. The uniformity and linearity of these lasers was evident.

For SBH lasers with 10 μm and 5 μm wide active layers, current thresholds were 150 mA–180 mA and 90 mA–150 mA, respectively, while the external quantum efficiencies were 44%–63% and 25%–35%. The lower external quantum efficiency of the lasers with 5 μm strips was due to: (1) the larger top channel-to-strip width ratio, about 2, as compared to about 1.5 for lasers with 10 μm strips, and (2) the fact that as the top channel width decreases, the amount of lateral current spreading in the p-GaAs and p-Al$_{0.3}$Ga$_{0.7}$As layers increases rapidly. By using more efficient lateral current confinement schemes, such as laterally spaced, reverse-biased junctions at the substrate interface in addition to those of FIG. 1, we believe that much lower current thresholds can be obtained.

The far-field patterns, both along and perpendicular to the junction plane, at various current levels above threshold were also measured for a typical SBH laser with a nominal 5 μm wide active layer. These patterns were measured under pulsed operation up to 9 times threshold. In the current region examined, the lasers operated stably in the fundamental mode in both transverse directions with no significant distortion of the field patterns. In general, the beam divergences were about 8–10 degrees and 26–30 degrees in the directions parallel and perpendicular to the junction plane, respectively. For lasers with 10 μm wide active layers, higher order modes along the junction plane were excited near threshold and successively changed into even higher order modes as the current injection level was increased. We observed, however, no "kink" or other nonlinearity associated with mode transition. Lasers with 5 μm wide active layers, under pulsed operation, exhibited single longitudinal mode oscillation at injection currents as high as twice threshold. In general, lasing occurred in several longitudinal modes at slightly above the threshold current $I_{th}$ ($\lesssim 1.05\ I_{th}$), but the lasing power quickly concentrated into a single longitudinal mode with a slight increase in current. With increasing current, the longitudinal mode shifted to an adjacent shorter wavelength mode, staying predominantly a single mode over wide current intervals except during the brief mode transitions. Such current intervals shortened for high injection current levels.

It is to be understood that the above-described arrangements are merely illustrative of the many specific embodiments which can be devices to represent application of the principles of our invention. Numerous and varied other arrangements can be devices in accordance with these principles by those skilled in the art without departing from the spirit and scope of the invention. In particular, in each of the embodiments of our SBH laser it is readily possible to fabricate the strip active layer so that it is shorter than the resonator (i.e., the active layer terminates short of the mirror facets), thereby virtually eliminating surface recombination at the facets. Thus, the active layer would be entirely embedded in wider bandgap material. Also note that with this modification to FIG. 3, the DFB gratings near the facets can be made to extend across the width of the laser.

What is claimed is:
1. A heterostructure junction laser comprising
means forming an optical resonator having an axis along which stimulated radiation of said laser propagates,
first and second wide bandgap semiconductor cladding layers of opposite conductivity types,
a narrower bandgap semiconductor active region disposed between and contiguous with said cladding layers, and
electrode means for forward biasing said cladding layers so as to inject minority carriers into said active region and for applying pumping current to said active region in excess of the lasing threshold, thereby to cause said active region to emit said radiation along said resonator axis, characterized in that said active region includes
a waveguide layer having a bandgap smaller than that of said cladding layers, and
an active layer, wherein said radiation is generated, having the shape of a narrow strip extending along said resonator axis, said active layer being contiguous with and optically coupled to said waveguide layer,
said active layer having a bandgap smaller than that of said waveguide layer and being adapted so that the difference in bandgap between said waveguide and active layers is, on the one hand, sufficiently large to confine said minority carriers to said active layer and, on the other hand, small enough to enable a significant portion of said radiation to penetrate into said waveguide layer.
2. The laser of claim 1 wherein said active and waveguide layers are of opposite conductivity types.
3. The laser of claim 1 wherein said active and waveguide layers are of the same conductivity type.
4. The laser of claim 1 wherein said active layer is adjacent a major surface of said waveguide layer and said surface, on opposite sides of said active layer, comprises p-n heterojunctions effective to prevent any substantial amount of said pumping current from bypassing said active layer.
5. The laser of claim 1 wherein said active layer is formed on top of a major surface of said waveguide layer.

6. The laser of claim 1 wherein said active layer is partially embedded in said waveguide layer so that a major surface of said active layer is essentially coplanar with a major surface of said waveguide layer.

7. The laser of claim 1 further including means for constraining said pumping current to flow transversely through said layers in a narrow channel which is in substantial registration with said strip-shaped active layer.

8. The laser of claim 1 wherein said active layer is adjacent a major surface of said waveguide layer, thereby defining laterally separate zones of said surface on opposite sides of said active layer, and wherein said resonator means includes on each of said zones distributed feedback gratings comprising a plurality of parallel grooves which extend in a direction essentially perpendicular to said resonator axis.

9. A heterostructure junction laser comprising
means forming an optical resonator having an axis along which stimulated radiation of said laser propagates,
first and second wide bandgap semiconductor cladding layers of opposite conductivity types,
a narrower bandgap semiconductor active region disposed between and contiguous with said cladding layers, and
electrode means for forward biasing said cladding layers so as to inject minority carriers into said active region and for applying pumping current to said active region in excess of the lasing threshold, thereby to cause said active region to emit said radiation along said resonator axis, characterized in that
said active region includes:
a waveguide layer having a bandgap smaller than that of said cladding layers, and
an active layer, wherein said radiation is generated, having the shape of a narrow strip extending along said resonator axis,
said active layer being contiguous with and having a smaller bandgap than said waveguide layer, the difference in bandgap between said waveguide and active layers being, on the one hand, sufficiently large to confine said minority carriers to said active layer and, on the other hand, small enough to enable a significant portion of said radiation to penetrate into said waveguide layer,
said active layer being adjacent a major surface of said waveguide layer, thereby defining laterally separate zones of said surface on opposite sides of said active layer, said zones forming p-n heterojunctions with one of said cladding layers effective to prevent any substantial flow of said pumping current across said zones, and
further characterized in that
said laser includes means for constraining said pumping current to flow transversely through said layers in a narrow channel which is in substantial registration with said strip-shaped active layer.

10. The laser of claim 9 wherein said active and waveguide layers are of opposite conductivity types.

11. The laser of claim 9 wherein said active and waveguide layers have the same conductivity type.

12. The laser of claim 9 wherein said active layer is formed on top of a major surface of said waveguide layer.

13. The laser of claim 9 wherein said active layer is partially embedded in said waveguide layer so that a major surface of said active layer is essentially coplanar with a major surface of said waveguide layer.

14. The laser of claim 9 wherein said resonator means includes on each of said zones distributed feedback gratings comprising a plurality of parallel grooves in said major surface which extend in a direction essentially perpendicular to said resonator axis.

15. The laser of claim 9 wherein
said first cladding layer comprises $Al_xGa_{1-x}As$, $0<x<1$,
said second cladding layer comprises $Al_qGa_{1-q}As$, $0<q<1$,
said waveguide layer comprises $Al_yGa_{1-y}As$, $0<y<1$; $y<x$ and $q$, and
said active layer comprises $Al_zGa_{1-z}As$, $0 \leq z<1$; $z<y$.

16. The laser of claim 15 wherein
said first cladding layer is n-type
said waveguide layer is n-type and is formed on said first cladding layer, and
said second cladding layer is p-type and is formed on said waveguide layer and said active layer.

17. A heterostructure junction laser, which has an essentially linear radiation output—versus—pumping current characteristic for all currents between the lasing and catastrophic damage thresholds and which oscillates stably in a fundamental transverse and single longitudinal mode, comprising
an n-GaAs substrate,
an n-$Al_xGa_{1-x}As$ first cladding layer, $0<x<1$, formed on said substrate,
an n-$Al_yGa_{1-y}As$ waveguide layer, $0<y<1$, $y<x$, formed on said first cladding layer,
an $Al_zGa_{1-z}As$ active layer, $0 \leq z<1$; $z<y$, formed on said waveguide layer in the shape of a narrow strip which extends along the resonator axis of said laser, the thickness and width of said active layer being less than about 0.2 $\mu$m and 10 $\mu$m, respectively,
a p-$Al_qGa_{1-q}As$ second cladding layer formed on said active and waveguide layers, $0<q<1$; $q>y$ and $z$, thereby forming a pair of p-n heterojunctions separated by said active layer,
means forming an optical resonator having an axis along which stimulated radiation of said laser propagates,
electrode means for forward biasing said cladding layers so as to inject minority carriers into said active layer and for applying pumping current to said active layer in excess of the lasing threshold, thereby to cause said active layer to emit said radiation along said resonator axis,
means forming at least one pair of laterally spaced p-n junctions which define an elongated window therebetween in substantial registration with said active layer and which are reverse biased when said cladding layers are forward biased, thereby to constrain said pumping current to flow in a narrow channel between said window and said active layer,
the difference (y−z) being large enough, on the one hand, to confine said minority carriers to said active layer, yet small enough, on the other hand, to enable a substantial portion of said radiation to penetrate from said active layer into said waveguide layer, and
the difference (q−y) being large enough to prevent any substantial amount of said pumping current from flowing across said heterojunctions and thereby bypassing said active layer.

18. The laser of claim 17 wherein said active layer is p-type.

19. The laser of claim 17 wherein said active layer is n-type.

20. The laser of claim 17 wherein the width of said active layer is not greater than about 5 μm and said waveguide layer is much thicker than said active layer.

21. The laser of claim 20 wherein x and q are approximately 0.3, y is approximately 0.1 and z is approximately zero.

* * * * *